(12) United States Patent
Korenaga

(10) Patent No.: US 7,282,819 B2
(45) Date of Patent: Oct. 16, 2007

(54) STAGE APPARATUS, EXPOSURE APPARATUS, AND DEVICE MANUFACTURING METHOD

(75) Inventor: Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 429 days.

(21) Appl. No.: 10/983,573

(22) Filed: Nov. 9, 2004

(65) Prior Publication Data

US 2005/0140215 A1  Jun. 30, 2005

(30) Foreign Application Priority Data

Nov. 10, 2003  (JP) .............................. 2003-380079

(51) Int. Cl.
   *H02K 41/00* (2006.01)
   *G03B 27/42* (2006.01)
(52) U.S. Cl. .................. 310/12; 355/53; 250/491.1; 74/471 XY
(58) Field of Classification Search .................. 310/12
   See application file for complete search history.

(56) References Cited

U.S. PATENT DOCUMENTS

| | | | |
|---|---|---|---|
| 4,244,629 A * | 1/1981 | Habermann | 310/90.5 |
| 4,684,315 A * | 8/1987 | Sugishima et al. | 414/749.2 |
| 5,196,745 A * | 3/1993 | Trumper | 310/12 |
| 5,467,720 A | 11/1995 | Korenaga et al. | 108/20 |
| 5,518,550 A | 5/1996 | Korenaga et al. | 118/729 |
| 5,631,617 A * | 5/1997 | Morishita | 335/216 |
| 5,684,856 A | 11/1997 | Itoh et al. | 378/34 |
| 5,760,500 A * | 6/1998 | Kondo et al. | 310/12 |
| 5,780,943 A * | 7/1998 | Ono | 310/12 |
| 5,841,250 A | 11/1998 | Korenaga et al. | 318/135 |
| 6,002,465 A | 12/1999 | Korenaga | 355/53 |
| 6,037,680 A | 3/2000 | Korenaga et al. | 310/12 |
| 6,040,675 A * | 3/2000 | Ono | 318/649 |
| 6,049,186 A * | 4/2000 | Lee | 318/611 |
| 6,107,703 A | 8/2000 | Korenaga | 310/12 |
| 6,128,069 A | 10/2000 | Korenaga | 355/53 |
| 6,157,159 A | 12/2000 | Korenaga et al. | 318/649 |
| 6,172,738 B1 | 1/2001 | Korenaga et al. | 355/53 |
| 6,177,978 B1 | 1/2001 | Korenaga | 355/53 |
| 6,265,793 B1 | 7/2001 | Korenaga | 310/12 |
| 6,320,645 B1 | 11/2001 | Inoue et al. | 355/53 |

(Continued)

FOREIGN PATENT DOCUMENTS

JP   11-190786   7/1999

*Primary Examiner*—Burton Mullins
(74) *Attorney, Agent, or Firm*—Fitzpatrick, Cella, Harper & Scinto

(57) ABSTRACT

A stage apparatus in which support units supporting a counter-mass surface plate on a reference surface each include a first permanent magnet disposed on one of the surface plate and the reference surface, and a pair of second permanent magnets disposed on the other of the surface plate and the reference surface so as to sandwich the first permanent. This stage apparatus is arranged to satisfy the following relations: (1) [(stroke of movement of the stage in a first direction)×(mass of moving portion of the stage in the first direction)/(mass of surface plate)]<[total sum of spaces between the first and second permanent magnets in the first direction]; and/or (2) [(stroke of movement of the stage in a second direction)×(mass of moving portion of the stage in the second direction)/(mass of surface plate)]<[total sum of the lengths in the second direction, of the second permanent magnets facing the first permanent magnet].

7 Claims, 12 Drawing Sheets

U.S. PATENT DOCUMENTS

| | | | |
|---|---|---|---|
| 6,359,677 B2 | 3/2002 | Itoh et al. | 355/53 |
| 6,414,742 B1 | 7/2002 | Korenaga et al. | 355/53 |
| 6,479,991 B1 | 11/2002 | Korenaga | 324/226 |
| 6,665,053 B2 | 12/2003 | Korenaga | 355/72 |
| 6,770,890 B2 * | 8/2004 | Tanaka | 250/442.11 |
| 6,879,127 B2 * | 4/2005 | Gery | 318/649 |
| 2002/0021423 A1 | 2/2002 | Korenaga et al. | 355/53 |
| 2003/0007140 A1 | 1/2003 | Korenaga | 355/72 |
| 2003/0102723 A1 | 6/2003 | Korenaga | 310/12 |
| 2003/0179359 A1 | 9/2003 | Korenaga | 355/75 |
| 2003/0217694 A1 | 11/2003 | Korenaga | 118/500 |
| 2004/0041103 A1 | 3/2004 | Korenaga | 250/492.2 |
| 2004/0095563 A1 | 5/2004 | Korenaga | 355/51 |
| 2004/0100153 A1 | 5/2004 | Korenaga | 310/12 |
| 2004/0126907 A1 | 7/2004 | Korenaga | 438/10 |
| 2004/0164470 A1 | 8/2004 | Korenaga | 267/140.15 |

\* cited by examiner

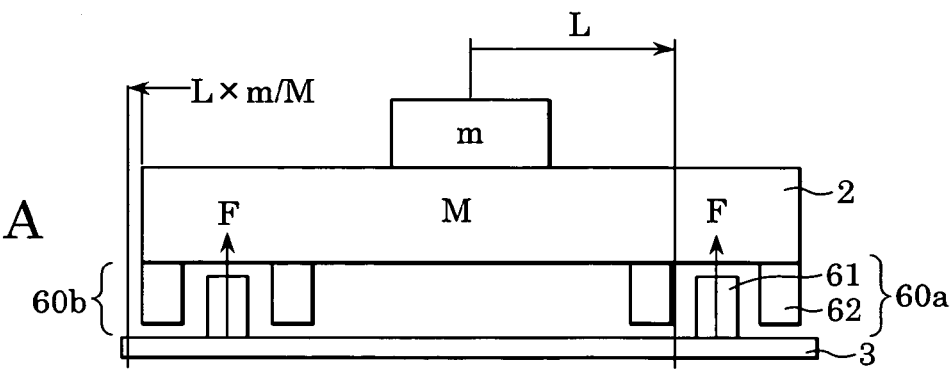
FIG. 11A
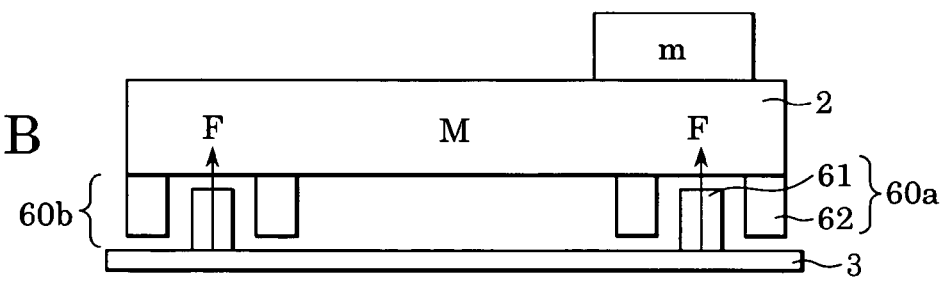
FIG. 11B
FIG. 12
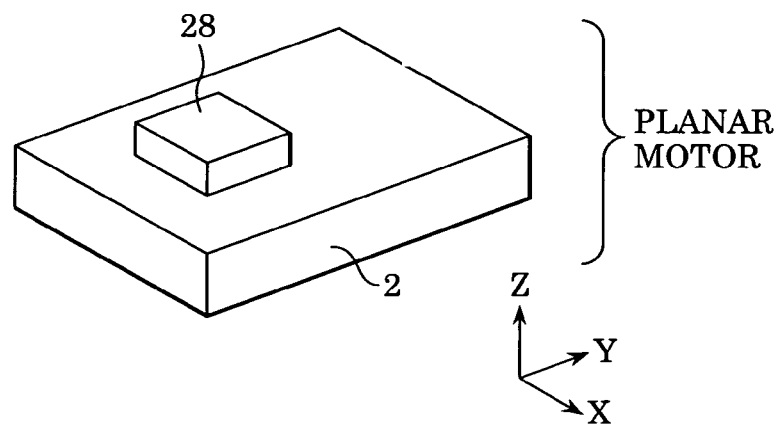

STAGE APPARATUS, EXPOSURE APPARATUS, AND DEVICE MANUFACTURING METHOD

BACKGROUND OF THE INVENTION

1. Field of the Invention

The present invention relates to a stage apparatus that is suitably used for a semiconductor exposure apparatus, an inspection apparatus, or the like, and that positions an exposure original plate, an object to be exposed, or an object to be inspected, in a predetermined position. The present invention also relates to an exposure apparatus and a device manufacturing method.

2. Description of the Related Art

In a semiconductor manufacturing process, in a projection exposure apparatus in which a pattern of a reticle (or mask) serving as an original plate is projected and transferred onto a semiconductor (silicon) wafer serving as an exposure substrate, when the reticle pattern is projected and exposed onto the wafer, a reticle stage and/or a wafer stage, i.e., a stage apparatus, is used to move the reticle and the wafer with respect to the projection exposure system.

In such a stage apparatus, a drive reaction force occurring when driving the stage undesirably causes a reduction in accuracy of the stage. As a countermeasure against this problem, there is a method disclosed in Japanese Patent Laid-Open No. 11-190786, for example (see FIG. 15 in the present description).

As shown in FIG. 15, an X slider 30 and a Y slider 33, each serving as a wafer stage, are slidably supported on a stage surface plate 2 by an air slide (not shown), and when each of them receives an acceleration force, its reaction force acts on the stage surface plate 2. Because the stage surface plate 2 is slidably supported on a base surface plate 3 by an air slide (not shown), the stage surface plate 2 moves due to the reaction force, and no force acts on the base surface plate 3. That is, the stage surface plate 2 functions as a counter-mass with respect to the X slider and the Y slider, thereby canceling out the reaction force and preventing it from being transmitted to the outside.

When the X slider 30 or the Y slider 33 accelerates at a position deviated from the barycenter of the stage surface plate 2 in the X direction or the Y direction, a rotational force about the Z axis occurs. Also, when the barycenter of the X slider 30 or the Y slider 33 deviates from that of the stage surface plate 2 in the Z direction, rotational forces about the X axis and the Y axis occur. These rotational forces are undesirably transmitted to the base surface plate 3. As a countermeasure against this, the stage surface plate 2 is provided with counter rotors 4 rotating about the X axis and the Y axis, and also, a counter rotor (not shown) rotating about the Z axis, and each of these counter rotors 4 is rotated in synchronization with the occurrence of a respective one of the rotational forces to cancel out the rotational force.

As disclosed in Japanese Patent Laid-Open No. 11-190786, when the stage surface plate is supported as a counter-mass on the base surface plate by an air slide, there occurs the need to provide the air slide with a required degree of flatness over a wide region, so that it is difficult to enlarge the stage surface plate. However, a small stage surface plate, that is, a stage surface plate that is small in mass, would undesirably increase the moving amount required of the stage surface plate serving as a counter-mass, thereby increasing the region requiring a high degree of flatness in the base surface plate.

For this reason, when supporting the stage surface plate as a counter-mass on the base surface plate by an air slide, it is difficult to cancel out the stage drive reaction force to provide a high-accuracy stage apparatus.

On the other hand, when supporting the stage surface plate by rolling bearings of a linear motor guide (LM guide), or the like, instead of the air slide, an endurance problem occurs, and there is a concern that vibrations due to moving in and out of ball bearings can occur. Furthermore, either one of the linear motor guide and the air slide undesirably transmits vibrations in the Z direction to the stage, and hence, in this case, it is necessary to further provide a vibration isolating foundation for isolating the vibrations in the Z direction.

SUMMARY OF THE INVENTION

It is an object of the present invention to provide a high-accuracy, high-endurance stage apparatus using a counter-mass surface plate.

To achieve the above-described object, the present invention provides a stage apparatus including a movable member that moves at least in a first direction and a second direction, a mounting base supporting the movable member, and moving on a reference surface so as to cancel out a reaction force resulting from a movement of the movable member, and support means for supporting the mounting base on the reference surface. Herein, the support means includes: a first magnet unit disposed on one of the reference surface and the mounting base, and a second magnet unit including a pair of permanent magnets, which is disposed on the other of the reference surface and the mounting base, and each of which is arranged so as to oppose the first magnet unit having the same kind of magnetic pole as that of the second permanent magnet, with the first magnet unit being between the pair of permanent magnets of the second magnet unit. In this stage apparatus, in a predetermined range of relative positions between the first magnet unit and the second magnet unit in the first and second directions, the dimension of each of the first magnet unit and the second magnet unit is set so that a force acting between the first magnet unit and the second magnet unit is reduced to a predetermined amount or less. Here, the phrase "a force acting therebetween is reduced to a predetermined amount or less" means that a force acting therebetween is reduced to a minimum.

It is preferable that the present invention satisfy the following relations:

(1) [(stroke of movement of the movable member in the first direction)×(mass of a moving portion of the movable member in the first direction)/(mass of the mounting base)]<[total sum of the spaces between the first magnet unit and the second magnet unit in the first direction]; and (2) [(stroke of movement of the movable member in the second direction)×(mass of a moving portion of the movable member in the second direction)/(mass of the mounting base)]<[total sum of the lengths in the second direction, of the second magnet unit facing the first magnet unit].

By virtue of those features, the present invention provides a high-accuracy, high-endurance stage apparatus using a counter-mass surface plate. The present invention eliminates the need for high-accuracy plane machining as compared with the case wherein air floatation is used for supporting a surface plate, thereby providing a cost advantage over the latter. Also, because the present invention is not subjected to a restriction on the size in plane machining, it has an effect of coping with the tendency toward larger strokes of the stage.

When the first permanent magnet is disposed on the mounting base, and the second permanent magnets are disposed on the reference surface, it is preferable that there be provided an area adjusting unit that makes adjustable the facing area between the first permanent magnet and each of the second permanent magnets. This allows a supporting force to be adjusted, and enables the balance of moments and spring characteristics to be easily adjusted.

The arrangement may be such that there is provided a reference surface for supporting the mounting base, and that the first permanent magnet is disposed on the reference surface while the second permanent magnets are disposed on the mounting base. This prevents the balance of moments from being lost without the need to provide the area adjusting unit.

Preferably, the movable member is driven by a planar motor.

Moreover, it is preferable that the stage apparatus be used for positioning a substrate in an exposure apparatus, and that devices be manufactured by this exposure apparatus. This allows high-integration devices to be manufactured and/or enables the devices to be manufactured at a reasonable yield.

Further objects, features and advantages of the present invention will become apparent from the following description of the preferred embodiments with reference to the attached drawings.

BRIEF DESCRIPTION OF THE DRAWINGS

FIGS. 11A and 11B are diagrams each explaining an operation of the X-Y stage according to the second embodiment.

FIG. 12 is a diagram of a planar motor according to a third embodiment of the present invention.

DESCRIPTION OF THE PREFERRED EMBODIMENTS

First Embodiment

Figure 1:
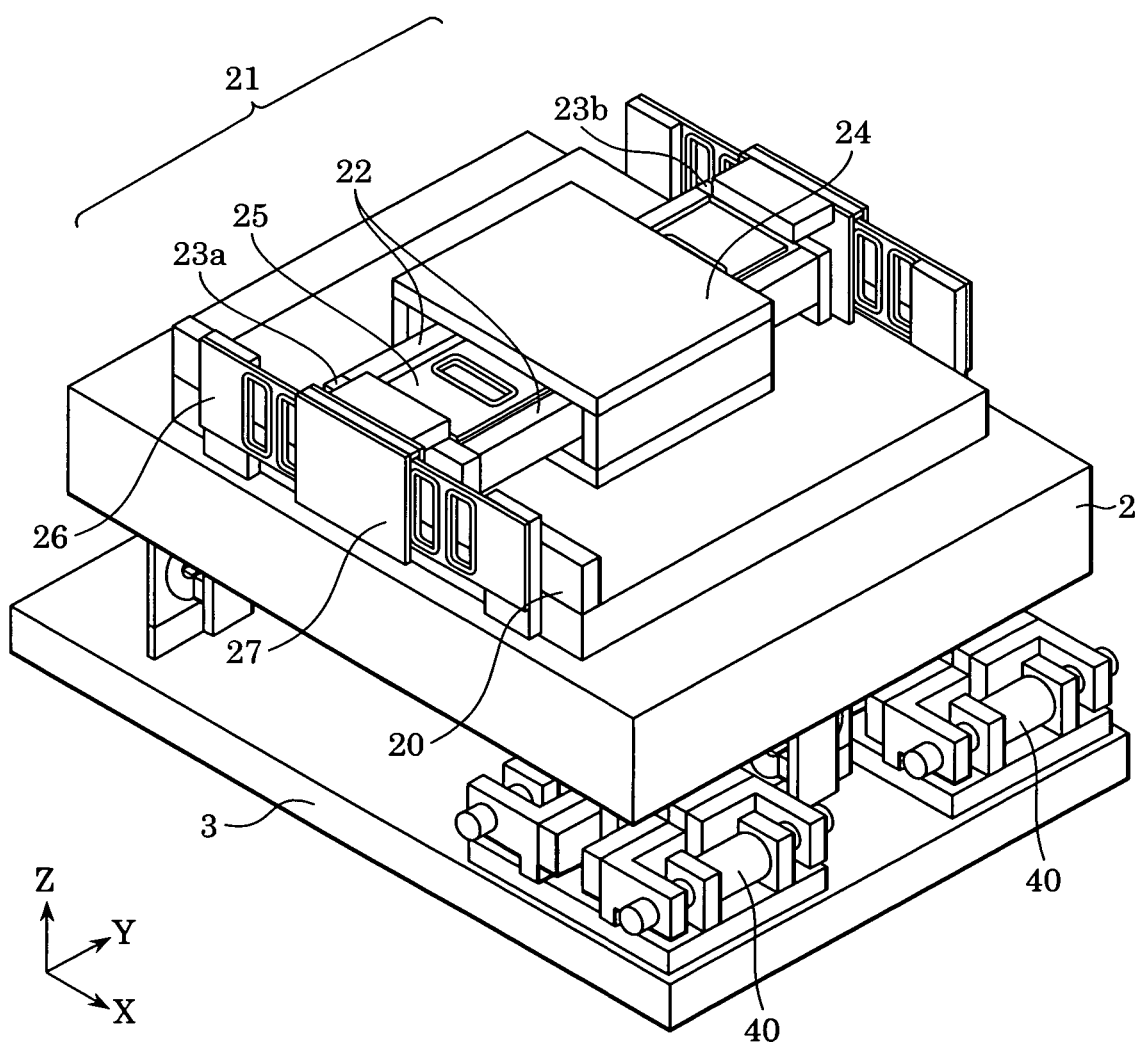
FIG. 1 is an overall perspective view of a stage apparatus according to a first embodiment of the present invention.
Figure 14:
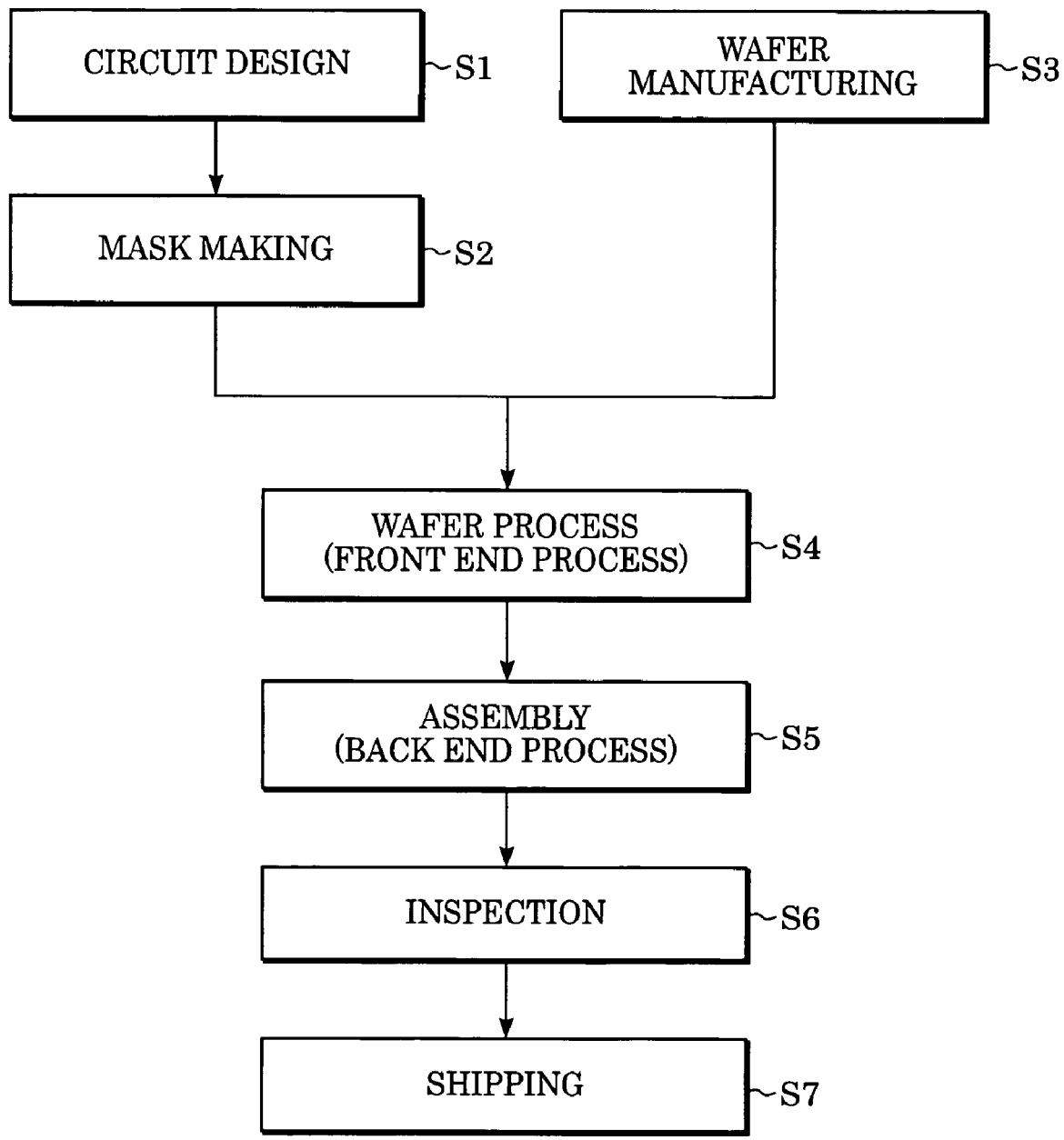
FIG. 14 is a block diagram showing a semiconductor manufacturing process according to a fifth embodiment of the present invention.
Figure 15:
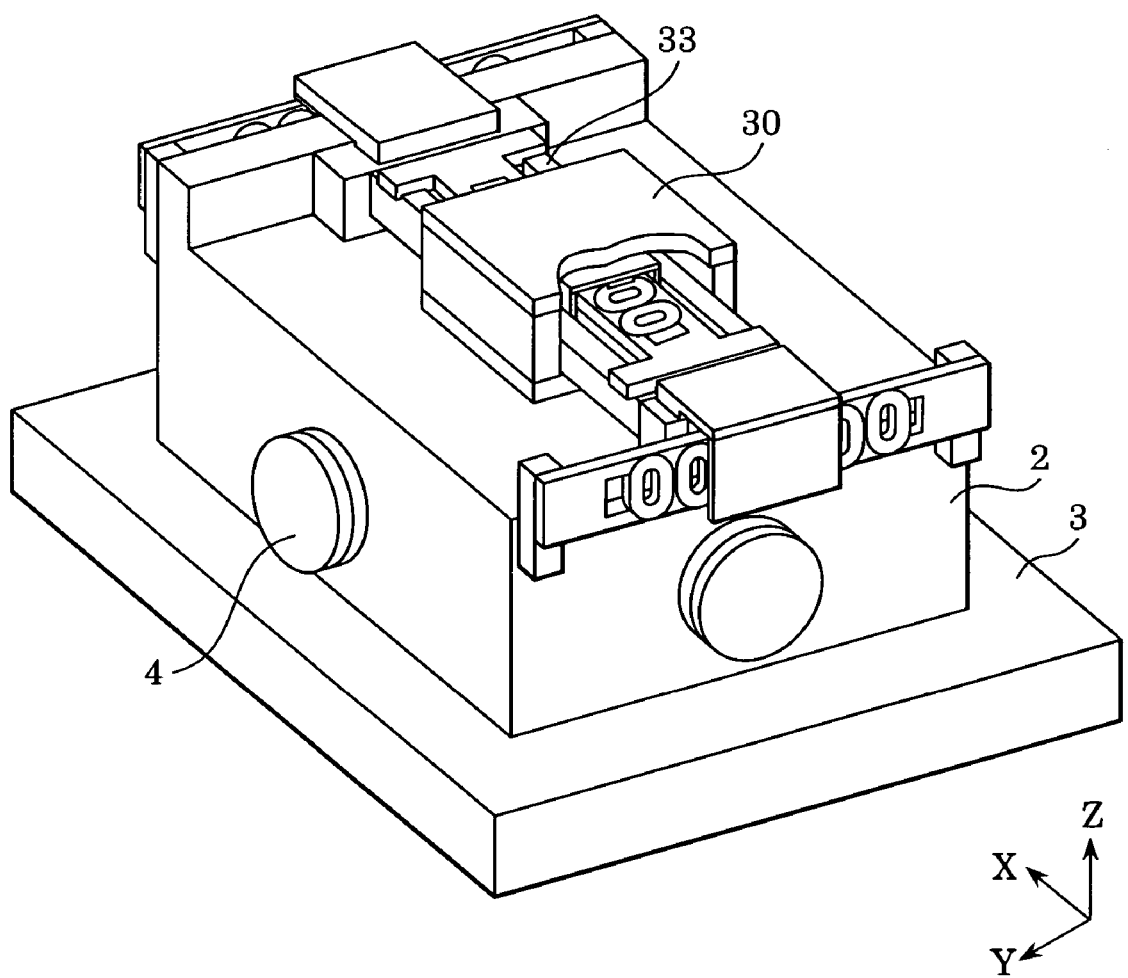
FIG. 15 is a conventional example of a stage apparatus.

FIGS. 1 to 5 show a stage apparatus according to a first embodiment of the present invention. FIG. 1 is a perspective view of the stage apparatus according to the first embodiment. In FIG. 1, the construction of the portion above a stage surface plate 2 is well known in the art. Through FIGS. 1 to 14, components having the same functions as those in FIG. 15 are designated by the same reference numerals.

In this stage apparatus, an X yaw guide 20 is fixed on a stage surface plate 2 serving as a mounting base. An X stage 21 is supported on a side surface of the X yaw guide 20 and on the top surface of the stage surface plate 2 by an air slide (not shown) so as to be movable in an X direction. Meanwhile, in FIGS. 1 and 2, one step of the plate having a guide function is provided on the stage surface plate 2, but this combined stage surface plate 2 and the one step of the plate is equivalent to a stage surface plate having a guide thereon, and, therefore, this one step of the plate is regarded as one being integrated with the stage surface plate 2. The X stage 21 mainly comprises Y yaw guides 22 and X sliders 23a and 23b. The X slider 23a faces the side surface of the X yaw guide 20 and the top surface of the stage surface plate 2 via air pads (not shown) disposed on a side surface and on the undersurface thereof. The X slider 23b faces the top surface of the stage surface plate 2 via an air pad (not shown) disposed on the undersurface thereof. As a result, as described above, the X stage 21 is supported on the side surface of the X yaw guide 20 and on the top surface of the stage surface plate 2 so as to be movable in the X direction.

On the other hand, a Y stage 24, which is guided by side surfaces of the Y yaw guides 22 serving as component members of the X stage 21 and by the top surface of the stage surface plate 2, is provided around the Y axis so as to surround the Y yaw guides 22 (i.e., so as to form a nesting structure). The Y stage 24 mainly comprises two Y stage side plates, a Y stage top plate at the upper end, and a Y stage bottom plate at the lower end. The Y stage bottom plate is supported in a noncontact manner on the stage surface plate 2 using an air pad (not shown) provided on the undersurface of the Y stage 24. The inner side surfaces of the Y stage 24 are supported in a noncontact manner by the Y yaw guides 22 using air pads (not shown) provided on the inner side surfaces of the Y stage 24. As a result, as described above, the Y stage 24 is supported on the side surfaces of the Y yaw guides 22 and on the top surface of the stage surface plate 2 so as to be movable in the Y direction.

Regarding a drive mechanism, for the drive in the Y direction, a linear motor stator 25 fixed to the X stage 21 and a linear motor movable element (not shown) fixed to the Y stage 24 are used. On the other hand, for the drive in the X direction, two linear motor stators 26 fixed to the stage surface plate 2 and a linear motor movable element 27 fixed to the X stage 21 are used. The linear motor stator 26 is formed by inserting a plurality of coils arranged in the stroke direction into a frame, and the linear motor movable element 27 is constituted by a box-shaped magnet unit. Thrust is generated by selectively feeding current into the coils of the stators in accordance with a position of the movable element 27.

Figure 2:
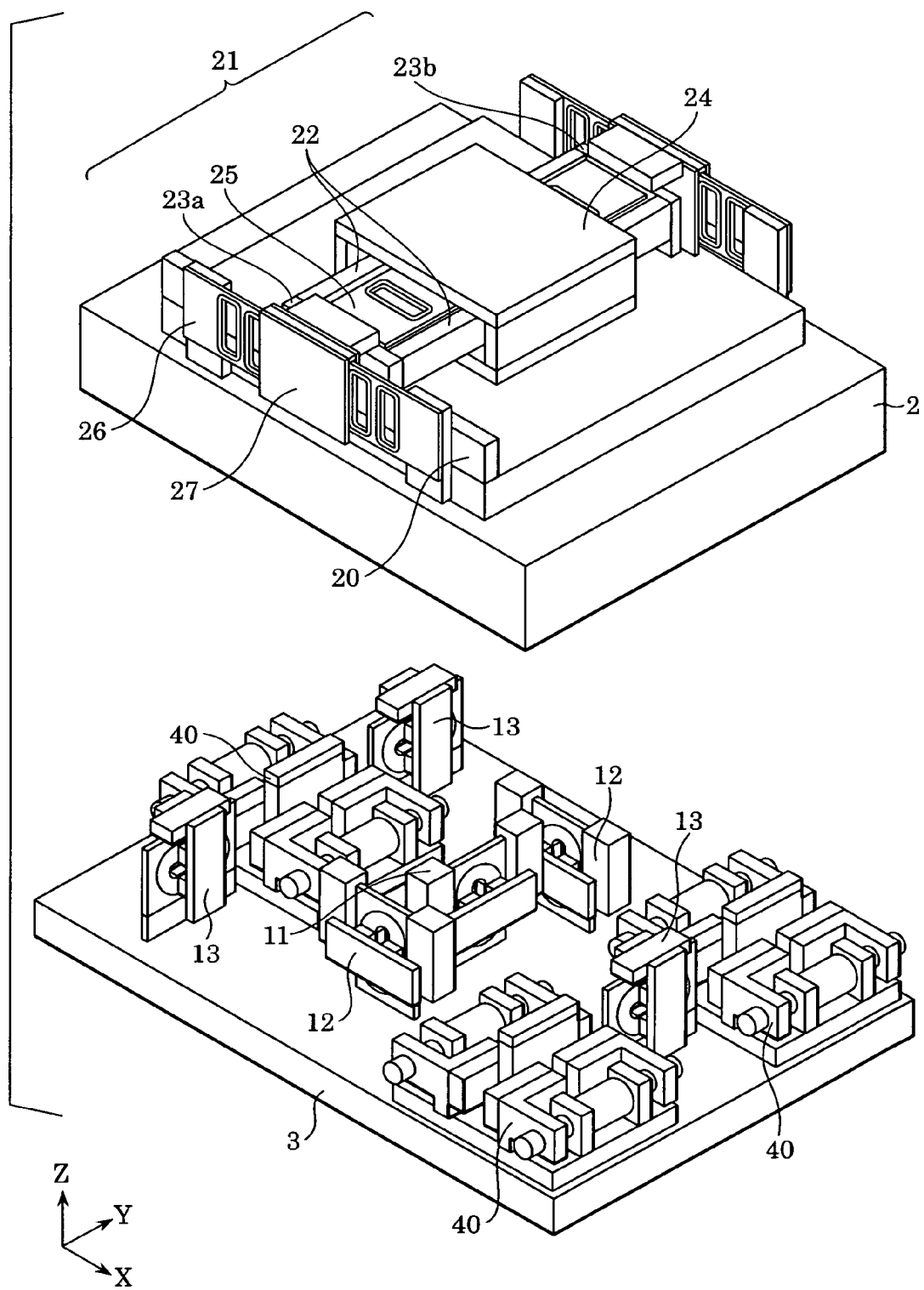
FIG. 2 is a perspective view of the stage apparatus shown in FIG. 1, wherein a stage surface plate is separated from a base surface plate.

The stage surface plate 2 is supported on the base surface plate 3 via three variable support units 40 serving as support means or support mechanisms. FIG. 2 shows the stage surface plate 2 shown in FIG. 1, which is separated from the base surface plate 3. Between the stage surface plate 2 and the base surface plate 3, besides three variable support units, there are provided one Y fine movement linear motor (LM) 11, two X fine movement linear motors 12, and three Z fine movement linear motors 13.

Hereinafter, the constructions of the fine movement linear motors 11, 12, and 13, and the support units 40 will be described.

Figure 3A:
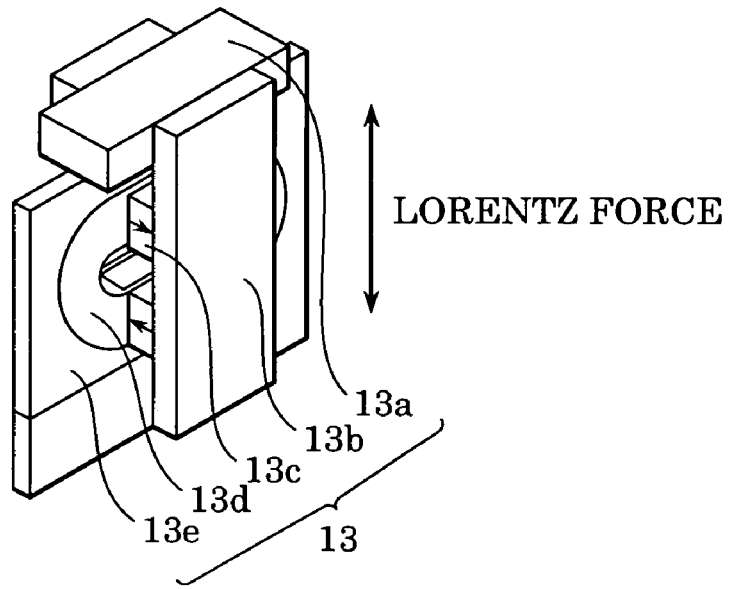
FIGS. 3A and 3B are each detailed views of a fine movement linear motor.
Figure 3B:
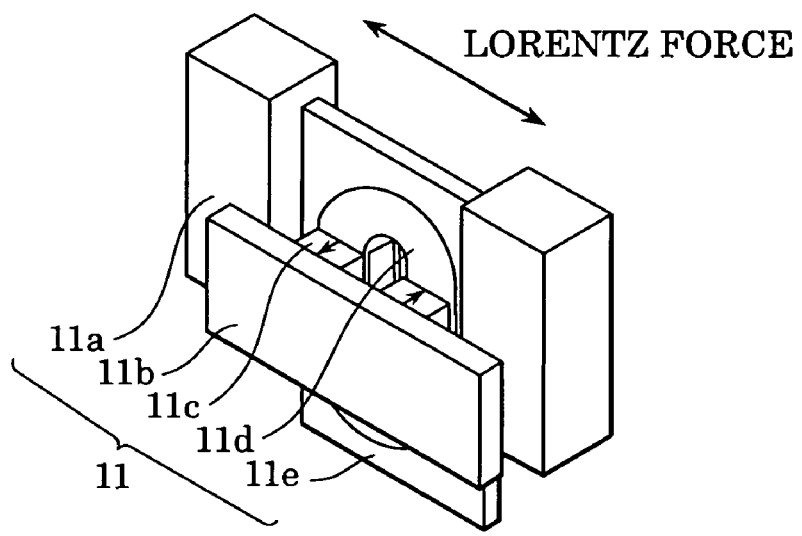

FIGS. 3A and 3B show details of the three Z fine movement linear motors. The Z fine movement linear motor 13 shown in FIG. 3A comprises a Z yoke fixing portion 13a, two Z yokes 13b provided so as to clamp the Z yoke fixing portion 13a, a bipolar permanent magnet 13c provided for each of the Z yokes 13b and magnetized in the thickness direction (the arrow direction in FIG. 3A), a flat-track-shaped Z coil 13d that faces the permanent magnets 13c in a noncontact manner, and a Z coil frame 13e for supporting the Z coil 13d. The Z yoke fixing portion 13a is fixed to the stage surface plate 2 side and the Z coil frame 13e is fixed to the base surface plate 3 side. When current is fed to the Z coil 13d, a Lorentz force in the Z direction is generated between the coil system and the magnet system.

The Y fine movement linear motor 11 shown in FIG. 3B comprises two Y yoke fixing portions 11a, two Y yokes 11b provided so as to clamp the Y yoke fixing portions 11a, a bipolar permanent magnet 11c provided for each of the Y yokes 11b and magnetized in the thickness direction (i.e., the arrow direction in FIG. 3B), a flat-track-shaped Y coil 11d that faces the permanent magnets 11c in a noncontact manner, and a Y coil frame 11e for supporting the Y coil 11d. The Y yoke fixing portions 11a are fixed to the stage surface plate 2 side and the Y coil frame 11e is fixed to the base surface plate 3 side. When current is fed to the Y coil 11d, a Lorentz force in the Y direction is generated between the coil system and the magnet system.

While not shown in FIGS. 3A and 3B, each of the X fine movement linear motors 12 has quite the same construction as that of the Y fine movement linear motor 11. When each of the X fine movement linear motors 12 is arranged as shown in FIG. 2 by rotating the entire structure about the Z axis through ninety degrees, it can generate a Lorentz force in the X direction.

Figure 4:
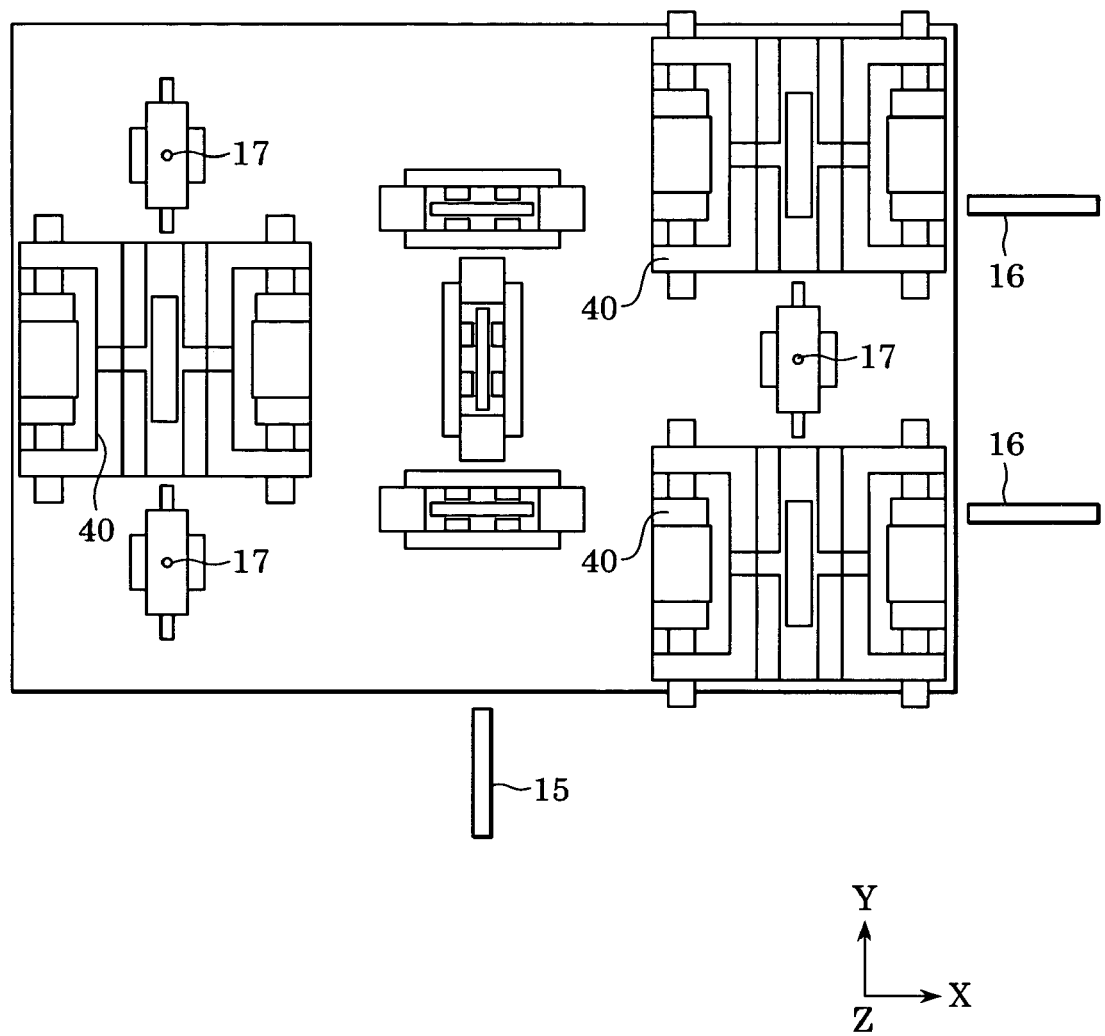
FIG. 4 is a top view of the base surface plate portion of the stage apparatus according to the first embodiment.

FIG. 4 is a plan view of the variable support units including the base surface plate 3 shown in FIG. 2 as viewed in the Z-axis direction. In the stage surface plate 2, positions in six axis directions are measured by one Y-direction gap sensor 15, two X-direction gap sensors 16, and three Z-direction gap sensors 17. The measured values are fed back to the above-described linear motor system so that the stage surface plate 2 does not largely deviate from the base surface plate 3. The gap sensors 15, 16, and 17 are fixed so as to have a predetermined positional relation with respect to the base surface plate 3.

Because the stage surface plate 2 functions as a counter-mass, it moves in an inverse direction (including a substantial inverse direction) in synchronization with the movement of an X-Y stage (X stage 21 and Y stage 24) accompanying acceleration/deceleration. Namely, the position in which the stage surface plate 2 functioning as a counter-mass ought to be, is uniquely determined with respect to the position to which the X-Y stage moves accompanying acceleration/deceleration. That the stage surface plate 2 does not largely deviate from the base surface plate 3 means that the stage surface plate 2 does not deviate from the above-described position in which the stage surface plate 2 ought to be, and it does not mean that the stage surface plate 2 does not move.

Figure 5A:
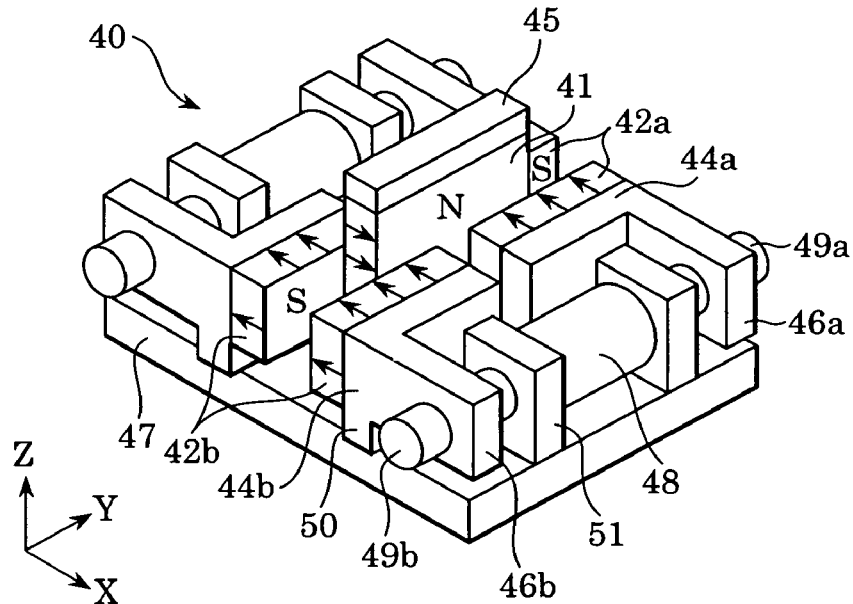
FIG. 5A is a detailed view of a variable support unit according to the first embodiment.
Figure 5B:
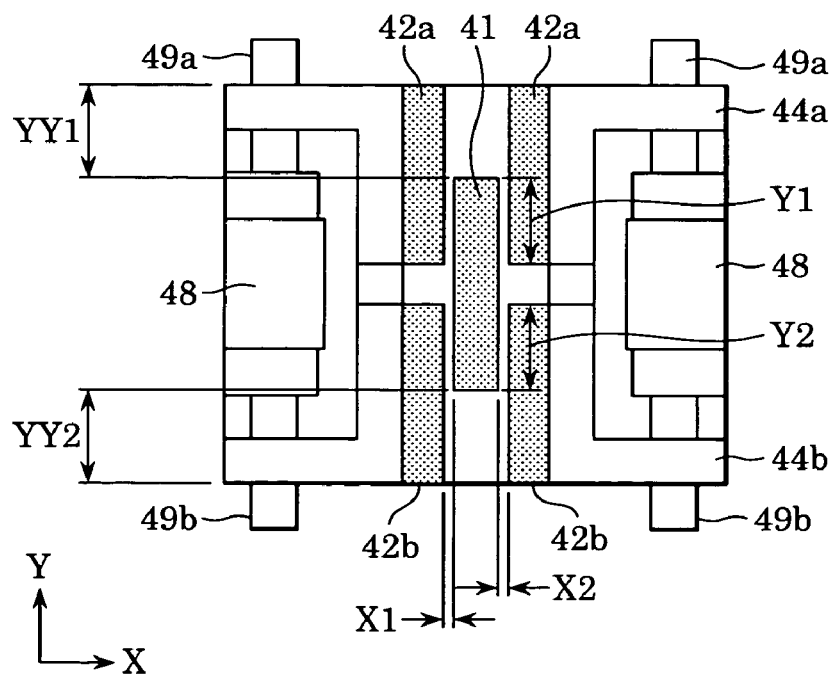
FIG. 5B is a detailed dimensional drawing of the variable support unit.

FIGS. 5A and 5B show details of the variable support unit 40. FIG. 5A is a perspective view of the variable support unit 40, and FIG. 5B is a plan view thereof as viewed in the Z-axis direction. The first permanent magnet 41 is fixed to the stage surface plate 2 via fixture member 45. A pair of permanent magnets 42, as second permanent magnets, is opposed to the first permanent magnet 41 in the X direction in a noncontact manner so as to sandwich the first permanent magnet 41. The first permanent magnet 41 and the pair of second permanent magnets 42 are magnetized in the thickness direction (i.e., the X direction in FIGS. 5A and 5B), and each of the pair of second permanent magnets 42 faces the first magnet unit having the same kind of magnetic pole as the first permanent magnet 41. Therefore, a repulsive force in the Z-axis direction (support direction) acts between the first permanent magnet 41 and each of the pair of second permanent magnets 42.

The pair of second permanent magnets 42 is each divided into second permanent magnet pieces 42a and 42b in the Y direction. These second permanent magnet pieces 42a and 42b are fixed to yokes 44a and 44b, respectively. The yokes 44a and 44b are arranged to be movable in the Y-axis direction by a guide 50 provided on a bottom plate 47 fixed to the base surface plate 3, and have nuts 46a and 46b, respectively. A motor 48 is fixed to the bottom plate 47 via a bracket 51, and fastened to feed screws 49a and 49b by a coupling (not shown). The feed screws 49a and 49b are threaded in directions opposite to each other. When the motor 48 rotates, the nuts 46a and 46b perform translation in directions opposite to each other at an identical pitch. For example, when the motor rotates in the positive direction, the nut 46a moves in the positive direction while the nut 46b moves in the negative direction. The movements of these nuts are transmitted to the yokes 44a and 44b, and ultimately, the relative positional relation between the second permanent magnet pieces 42a and 42b is set.

With these features, the yokes 44a and 44b move in directions opposite to each other in the Y-axis direction under the drive of the motor 48, and the facing area between the first permanent magnet 41 and each of the second permanent magnets 42 varies. The facing area is proportional to the distances (Y1+Y2) shown in FIG. 5B, and the support force in the Z direction also varies in accordance with the facing area. The relationship between the facing area and the force generated by the support unit 40 will be described later. The yoke drive system has sensors (not shown), which detect the moving amounts of the yokes 44a and 44b. The yokes 44a and 44b are controlled to move to a desired target position by a position servo mechanism (not shown) that causes the moving amount to conform to a target value.

Therefore, if only a force to be generated in each of the variable support units 40 is known, the yokes 44a and 44b move so as to generate these forces. The reason why the support force of each of the variable support units 40 is made variable is explained later.

Here, forces over the support units 40 will be explained.

When the X, Y, and Z coordinate axes of the variable support units 40 are taken along the directions shown in FIG. 5A, and the forces generated in these axes are designated by Fx, Fy, and Fz, respectively, the relationships between the displacements and the forces are represented by characteristic curves shown in FIGS. 6A to 6D. Here, for making it easier to understand, the yokes 44a and 44b are treated as being fixed in a state of being in contact with each other. The abscissas of the respective characteristic curves represent displacements of the first permanent magnet 41 in the X, Y, and X directions, and the ordinates thereof represent forces Fx, Fy, and Fz acting on the first permanent magnet 41.

Figure 6A:
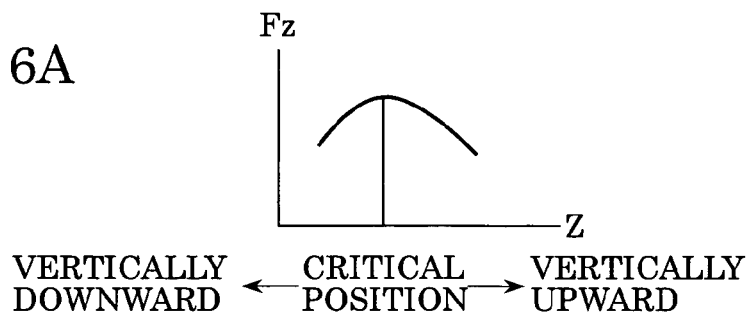
FIG. 6A is a diagram showing the relationship between the supporting force and the displacement in a Z direction.

FIG. 6A shows the relationship between the vertical displacement (displacement in the Z-axis direction) of the first permanent magnet 41 and the vertical force (Fz) acting thereon. The force Fz reaches its peak at a critical position in the Z direction. The vertical force (Fz) decreases not only when the first permanent magnet 41 displaces vertically upward from the critical position, but also when it displaces vertically downward from the critical position. The first permanent magnet 41 exhibits "spring characteristics" when it is located above the critical position, and "counter-spring characteristics" when it is located below the critical position.

The term "spring characteristics" refers to characteristics such that, when the displacement increases, a force acts in a direction to restore this displacement, while the term "counter-spring characteristics" refers to characteristics such that, when the displacement increases, a force acts in a direction to further increase the displacement.

The key feature of the characteristic curve shown in FIG. 6A is to have a critical position. At this position, the rate of change of the force generated by the first permanent magnet 41 in the vertical direction is zero. That is, $$dFz/dz = 0 \tag{1}$$

At this critical position, the spring constant becomes substantially zero, and no displacement occurs even when an external force (vibration) is applied. Namely, the vibration transmissibility becomes substantially zero, thereby allowing a large support force (Fz) to be generated. Accordingly, it is desirable that each of the support units 40 supports the stage surface plate 2 by arranging its first permanent magnet 41 at the critical position.

Figure 6B:
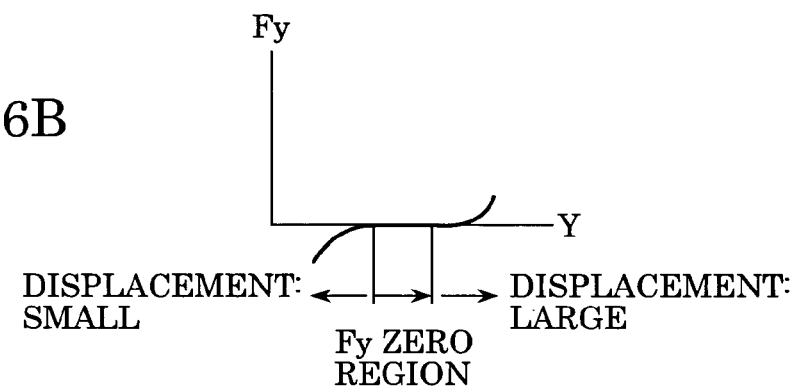
FIG. 6B is a diagram showing the relationship between the supporting force and the displacement in a Y direction.

FIG. 6B shows the relationship between the displacement in the moving direction (Y direction) of the first permanent magnet 41 along each of the surfaces of the second permanent magnets 42, and the Y-direction force (Fy). FIG. 6A includes a region ("Fy zero region" in FIG. 6B) where the Y-direction force becomes substantially zero only in a certain displacement segment. If the displacement in the Y direction further increases, exceeding the Fy zero region, a Y-direction force (Fy) is generated in the direction to increase the displacement. Likewise, if the displacement decreases, exceeding the Fy zero region, a Y-direction force (Fy) is generated in the direction to decrease the displacement. The key features of the characteristic curve of FIG. 6B lies in that it has a displacement region where the force in the Y direction becomes substantially zero, and that the vibration transmissibility becomes substantially zero in this region, so that no force is generated in the Y direction. Accordingly, it is desirable that each of the support units 40 supports the stage surface plate 2 by arranging its first permanent magnet 41 so as to be located within the Fy zero region.

Figure 6C:
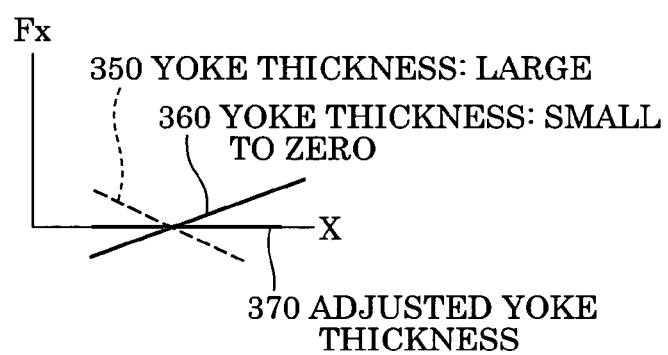
FIG. 6C is a diagram showing the relationship between the supporting force and the displacement in an X direction.

FIG. 6C shows the relationship between the displacement in the gap direction (X direction) between the first permanent magnet 41 and each of the second permanent magnets 42 and the X-direction force (Fx). The characteristics of force (Fx) generated in the X direction show different tendencies depending on the thicknesses of the yokes 44 attached to the rear surfaces of the second permanent magnets 42. In the first permanent magnet 41 and the second permanent magnets 42, since the same kind of poles face each other, usually, spring characteristics are to be caused by a repulsive force. That is, when the displacement increases, a force is to act in a direction opposite to the displacement. However, when the yokes 44 are provided on the rear surfaces of the second permanent magnets 42, the "counter-spring characteristics" are caused by the attracting forces of the first permanent magnet 41 and yokes 44. Namely, when the displacement increases, a force acts in a direction to further increase the displacement.

Since the permanent magnets (41 and 42) show the spring characteristics with respect to each other, as described above, the characteristics of the displacement in the gap direction (X direction) as the function of the force (Fx), which are obtained when the yokes 44 are attached, are a synthesis of the "counter-spring characteristics" and "spring characteristics". An increase in the thicknesses of the yokes 44 makes the counter-spring characteristics predominant. As a result, counter-spring characteristics are exhibited, as a whole, so that the characteristics indicated by a broken line 350 in FIG. 6C are obtained. On the other hand, thinning or eliminating the yokes 44 makes spring characteristics predominant, as a whole. As a result, the characteristics indicated by a solid line 360 in FIG. 6C are obtained. Appropriately adjusting and designing yoke thicknesses brings about characteristics indicated by a solid line 370 in FIG. 6C, in which the force shows no change in response to a displacement and in which the magnitude of the force itself is zero. Therefore, the formation of the support units 40 by appropriately setting the thicknesses of the yokes 44 allows the vibration transmissibility to be set to substantially zero, thereby making the characteristics of the support units 40 desirable.

Figure 6D:
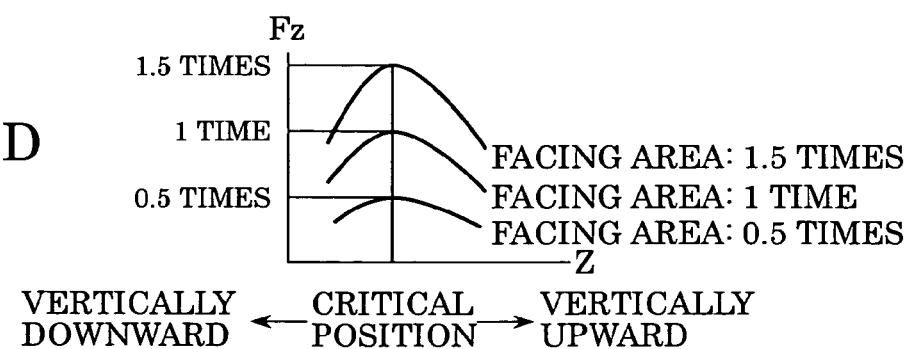
FIG. 6D is a diagram showing supporting forces in the Z direction and the facing areas between first and second permanent magnets.

FIG. 6D shows the relationship between the displacement in the Z direction and the force (Fz) obtained when the facing area of the first permanent magnet 41 and each of the second permanent magnets 42 is changed by changing the size of the first permanent magnet 41 in the Y direction. The characteristics of the displacement in the Z direction as a function of the force change in proportion to the facing area. Specifically, when the facing area of the permanent magnets (41 and 42) is multiplied by 0.5, the characteristics become ½ of those obtained when Fz is 1. When the facing area is multiplied by 1.5, the characteristics become 3/2 of those obtained when Fz is 1. This suggests that provided the facing area is variable, the force (Fz) to be generated can be variably controlled while maintaining the shape of the characteristic curve as it is.

Considering the above-described characteristics, it is desirable to arrange the support units 40 by designing their construction so that, in the support state, they generate a support force only in the support direction while generating substantially no force in directions other than the support direction, whereby the force does not change in response to a displacement in the X, Y, or Z direction. It is, however, difficult to stably hold the position with only the support units 40. Therefore, in order to auxiliarily hold the position of the stage surface plate 2 independently of the support units 40, the above-described six linear motors and six gap sensors are employed.

According to the above-described arrangements, an active anti-vibration apparatus having excellent vibration insulating characteristics can be implemented, in which the three support units 40, each having the first and second permanent magnets (41 and 42) and yokes 44, which realize the setting conditions including the critical position, the Fy zero region, and the yoke thicknesses described with reference to FIG. 6A to 6D, generate support forces only in the X-, Y-, and Z-axis directions, while generating substantially no force in response to displacements in directions other than the support direction, thereby realizing an active anti-vibration performance, and in which when an unexpected disturbance, or the like, is applied, a position and posture are held by a combination with weak positional control of the six fine movement linear motors based on position measurement of the gap sensors.

However, in order to achieve the above-described effects, the displacement of the first permanent magnet attached to the stage surface plate 2 must be restrained within a predetermined range. Otherwise, when the stage surface plate 2 moves as a counter-mass, there is a concern that the displacement largely deviates from the critical position (Fy zero region in FIG. 6B).

With this being the situation, the present invention is characteristically designed to satisfy the following relationships. In the dimensions of the variable support units 40 shown in FIG. 5B, the following relationships are met:

$$\text{stroke of the stage surface plate 2 in the } X \text{ direction} < (X1+X2) \quad (2); \text{ and}$$

$$\text{stroke of the stage surface plate 2 in the } Y \text{ direction} < (YY1+YY2) \quad (3).$$

Here, the stroke of the stage surface plate 2 in the X direction is determined by the stroke in which the X stage 21 accelerates and decelerates in the X direction together with the Y stage 24, and the ratio between the total sum of the masses of the X stage 21 and Y stage 24, and the mass of the stage surface plate 2. In other words, the stroke in the X direction of the stage surface plate 2 is determined by the stroke in which the X-Y stage (X stage 21 and Y stage 24) accelerates and decelerates in the X direction, and the ratio between the total sum of the mass of the portion moving to the X direction out of the X-Y stage and the mass of the stage surface plate 2. On the other hand, the stroke in the Y direction of the stage surface plate 2 is determined by the stroke in which the Y stage 24 accelerates and decelerates in the Y direction, and the ratio between the mass of the Y stage 24 and the mass of the stage surface plate 2. In other words, the stroke in the Y direction of the stage surface plate 2 is determined by the stroke in which the X-Y stage accelerates and decelerates in the Y direction, and the ratio between the mass of the portion moving to the Y direction out of the X-Y stage and the mass of the stage surface plate 2. The foregoing can be expressed by the following equations:

$$\text{stroke of the stage surface plate 2 in the } X \text{ direction} = (\text{stroke of the X-Y stage in the } X \text{ direction}) \times (\text{mass of a portion moving in the } X \text{ direction, of the X-Y stage})/(\text{mass of the stage surface plate 2}) \quad (4); \text{and}$$

$$\text{stroke of the stage surface plate 2 in the } Y \text{ direction} = (\text{stroke of the X-Y stage in the } Y \text{ direction}) \times (\text{mass of a portion moving in the } Y \text{ direction, of the X-Y stage})/(\text{mass of the stage surface plate 2}) \quad (5).$$

Here, the term "stroke of the stage" refers to a stroke of movement accompanying acceleration/deceleration, and this stroke determines the stroke of the surface plate stage 2. In the variable support units 40, unless the above condition (2) is satisfied, the first and each of the second permanent magnets make mutual contact, and unless the condition (3) is satisfied, the facing area between the first permanent magnet 41 and each of the second permanent magnets 42 decreases, resulting in a reduced support force or an occurrence of a force in the Y direction.

Meanwhile, although a counter-roller in the conventional example is not shown in FIG. 15, it is incorporated in the conventional example so as to cancel out a rotational force.

With the above-described features, once the X-Y stage (X stage 21 and Y stage 24) has moved in the X and/or Y direction, the stage surface plate moves in accordance with the mass ratio with respect to the X-Y stage, and the movement of the X-Y stage accompanying acceleration/ deceleration, and when a rotational force occurs by the movement, a counter-roller is rotated to cancel out the rotational force. As a result, the base surface plate 3 is subjected to neither a reaction force due to the movement of the X-Y stage, nor a rotational force.

Figure 7A:
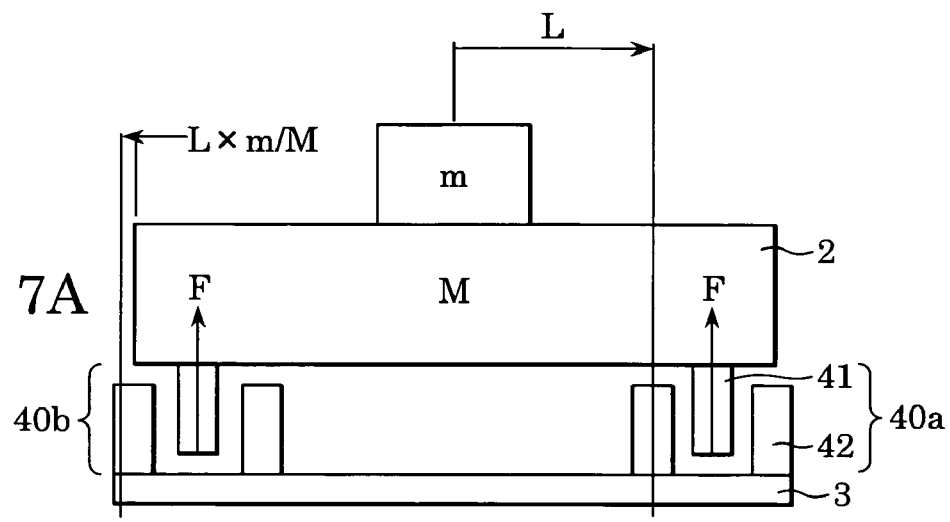
FIGS. 7A and 7B are diagrams each explaining an operation of an X-Y stage according to the first embodiment.
Figure 7B:
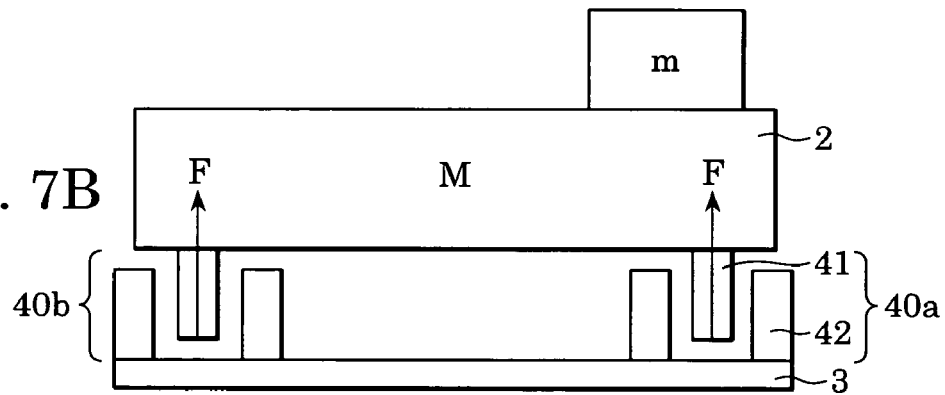

In order to maintain postures of the stage surface plate 2 and the X-Y stage, it is recommended that the support force of the variable support units 40 be made variable. FIGS. 7A and 7B, respectively, show states of the X-Y stage before and after movement. For the sake of simplification, the X-Y stage is represented by a mass m, and the stage surface plate 3 is represented by a mass M. Also, for the sake of simplification, the variable support units 40 are represented by two units 40a and 40b disposed equidistantly from the center.

Before movement, the mass m is just in the middle of the mass M. Here, either of the two support units 40a and 40b generates a force F=(m+M)/2. Next, when the X-Y stage moves by L on absolute coordinates, the stage surface plate 2 moves toward the opposite side by [m/(m+M)]×L on the absolute coordinates.

However, as described above, in the support units 40, even if the first permanent magnet 41 moves in the direction to get close to or get away from the second permanent magnets 42, or in the direction along the second permanent magnets 42, their support force is invariable. Therefore, when viewing a system in which only the stage surface plate 2 and the X-Y stage are taken out, the support force and the support force generating position are invariable with respect to this system even though the barycenter of the X-Y stage is moving, resulting in a lost balance of moments.

As a countermeasure against this, a correction is performed in which, in the support unit 40a on the right, its support force is increased by reducing the distance between the pair of second permanent magnets 42, and in which, in the support unit 40b on the left, its support force is reduced by increasing the distance between the pair of second permanent magnets 42.

For a quantitative analysis, letting the correction amounts of the three support reaction forces be $\Delta F1$, $\Delta F2$, and $\Delta F3$, and letting the positions of the three support units relative to the barycenter of the X-Y stage be (X1, Y1), (X2, Y2), (X3, Y3), the correction amounts are determined so as to satisfy the following relationships:

$$\Delta F1 + \Delta F2 + \Delta F3 = mg \quad (6)$$

$$\Delta F1 \cdot X1 + \Delta F2 \cdot X2 + \Delta F3 \cdot X3 = 0 \quad (7)$$

$$\Delta F1 \cdot Y1 + \Delta F2 \cdot Y2 + \Delta F3 \cdot Y3 = 0 \quad (8)$$

Unless this correction is performed, these support reaction forces $\Delta F1$, $\Delta F2$, and $\Delta F3$ must be generated by the fine movement linear motors 13, resulting in an undesirable increase in heating.

Second Embodiment

Figure 8:
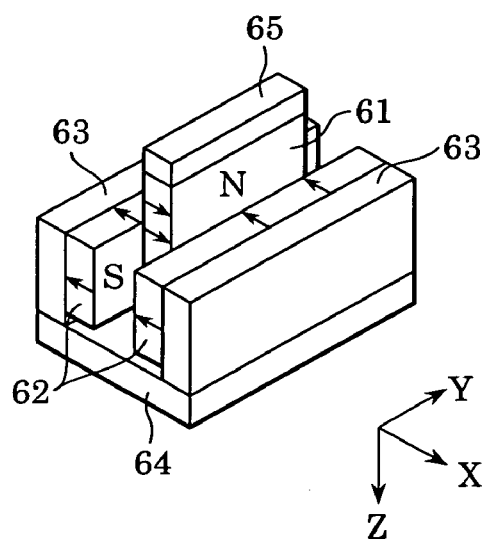
FIG. 8 is a detailed view of a supporting unit according to a second embodiment of the present invention.
Figure 9:
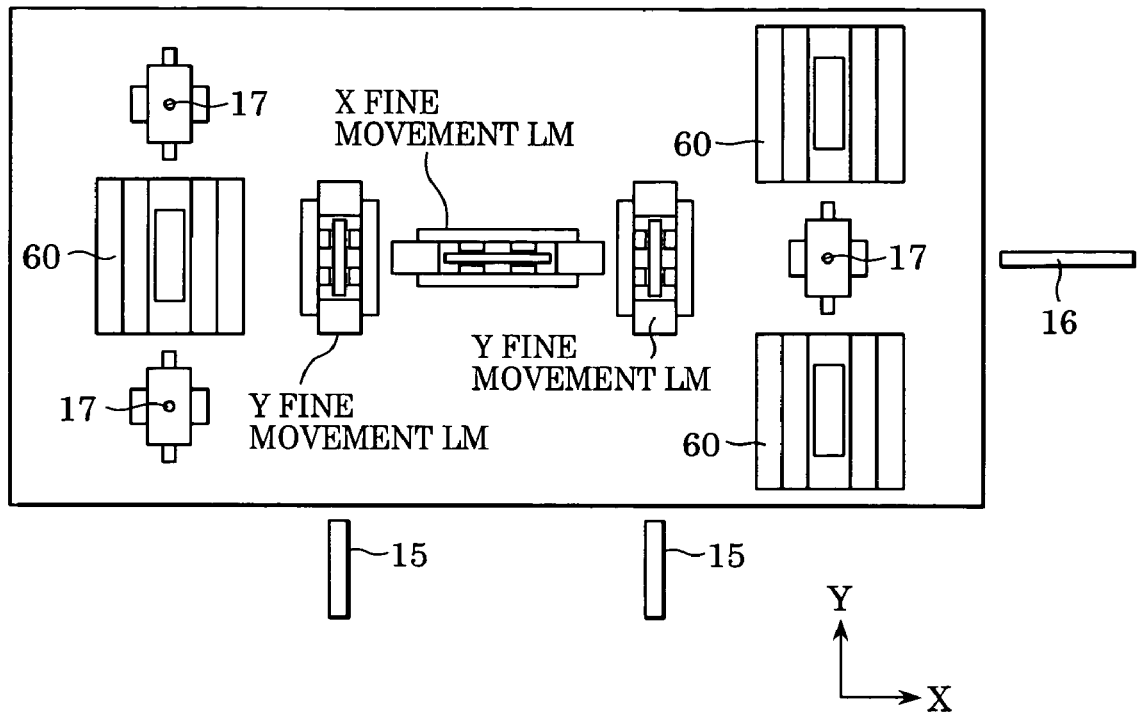
FIG. 9 is a top view of the base surface plate portion of the stage apparatus according to the second embodiment.

FIGS. 8 and 9 show a second embodiment according to the present invention. This embodiment is largely different from the first embodiment in that a first permanent magnet 61 is fixed to the base surface plate 3, that second permanent magnets 62 configured to sandwich the first permanent magnet 61 are fixed to the stage surface plate 2, and that support units 60 of which the support force is not variable as shown in FIG. 8 is used. Other arrangements and actions are substantially the same as those in the first embodiment.

In the support units 60 shown in FIG. 8, each of the second permanent magnets 62 is not divided and its support force is not variable. Other constructions are the same as those of the support units 40 shown in the first embodiment. A pair of second permanent magnets 62 is arranged so as to sandwich the first permanent magnet 61 magnetized in the direction of their thickness (X direction in FIG. 8), and in the first permanent magnet 61 and the second permanent magnets 62, the same kind of poles face each other in a noncontact manner. Yokes 63 are arranged on the rear surfaces of the second permanent magnets 62, and are each fixed to the top plate 64, which is fixed to the stage surface plate 2. The first permanent magnet 61 is fixed to the base surface plate 3 via the fixture member 65. The first permanent magnet 61 is arranged with an offset in the support direction, which is upward in the Z direction. Hence, a repulsive force in the Z direction acts between the first permanent magnet 61 and each of the second permanent magnets 62.

The rigidity in the X, Y, and Z directions is substantially zero, even in the support units 60, and the support force is invariant, even if the relative position between the first permanent magnet 61 and each of the second permanent magnets 62 moves in a horizontal direction.

Figure 10:
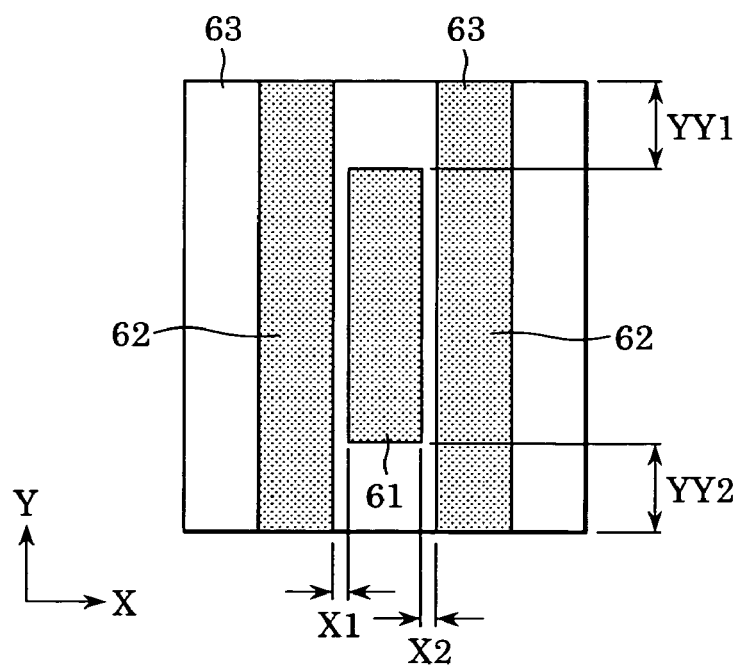
FIG. 10 is a detailed dimensional drawing of the supporting unit according to the second embodiment.

Also, as shown in FIG. 10, even in the support units 60, the following relations are satisfied:
stroke of the stage surface plate in the X direction<(X1+X2); and
stroke of the stage surface plate in the Y direction<(YY1+YY2).

FIGS. 11A and 11B, respectively, show states of the X-Y stage before and after the movement on the stage surface plate 2. For the sake of simplification, the X-Y stage is represented by a mass m, and the stage surface plate 3 is represented by a mass M. Also, for the sake of simplification, the variable support units 40 are represented by two units 40a and 40b disposed equidistantly from the center.

Before movement, the mass m is just in the middle of the mass M. Here, either of the two support units 60a and 60b generates a force F=(m+M)/2. Next, when the X-Y stage moves by L on absolute coordinates, the stage surface plate 2 moves toward the opposite side by [m/(m+M)]×L on the absolute coordinates.

At this time, since the first permanent magnet 61 is fixed to the base surface plate, unlike in the first embodiment, the positions supported by the three support units 60 are invariant in the absolute coordinate system. On the other hand, the barycentric position of the combined system of the stage surface plate 2 and the X-Y stage is also invariant in the absolute coordinate system. Therefore, there is no fear of loss of the moment balance, even if the support force is adjusted.

Third Embodiment

FIG. 12 shows a third embodiment according to the present invention, in which the above-described support units are applied to a stage apparatus using a planar motor. The stage apparatus according to the first and second embodiments is a so-called T-type stage, in which the X stage 21 and Y stage 24 are arranged so as to form a nesting structure, whereas the third embodiment is mainly characterized in that a single X-Y stage 28 is driven in the X and Y directions and that no guide is provided. In FIG. 12, while the support units are omitted from illustration, it is arranged below the stage surface plate 2. Also, the planar motor is well known in the art, so that a detailed explanation of its specific structure is omitted. This means that this embodiment is not limited to a specific structure of the planar motor. For example, the stage using a planar motor may be of a type of a triaxial drive in the X, Y, and ωz (rotational direction about the Z axis) directions, or, alternatively, may be of a type of a hexaxial drive in the X, Y, Z, ωx (rotational direction about the X axis), ωy (rotational direction about the Y axis), and ωz directions. The supporting of the self weight may be performed by using air, or, alternatively, by using magnets.

The mathematical expressions (2) and (3) in the first embodiment also hold in this embodiment. Furthermore, since the X-Y stage 28 serves both as the X stage 21 and the Y stage 24, these mathematical expressions can also be expressed as follows:

stroke of the stage surface plate 2 in the X direction=(stroke of the X-Y stage in the X direction)×(mass of the X-Y stage)/(mass of the stage surface plate 2)     (9);

and stroke of the stage surface plate 2 in the Y direction=(stroke of the X-Y stage in the Y direction)×(mass of the X-Y stage)/(mass of the stage surface plate 2)     (10).

Using a planar motor for a stage simplifies the structure, and eliminates the need to move the guide portion, thereby reducing the mass of the stage, and decreasing the stroke of the stage surface plate 2 when moving. This allows the distance between each of the second permanent magnets (e.g., 42) and the first permanent magnet (e.g., 41) to be shortened, and enables a larger support force to be generated.

Fourth Embodiment

Figure 13:
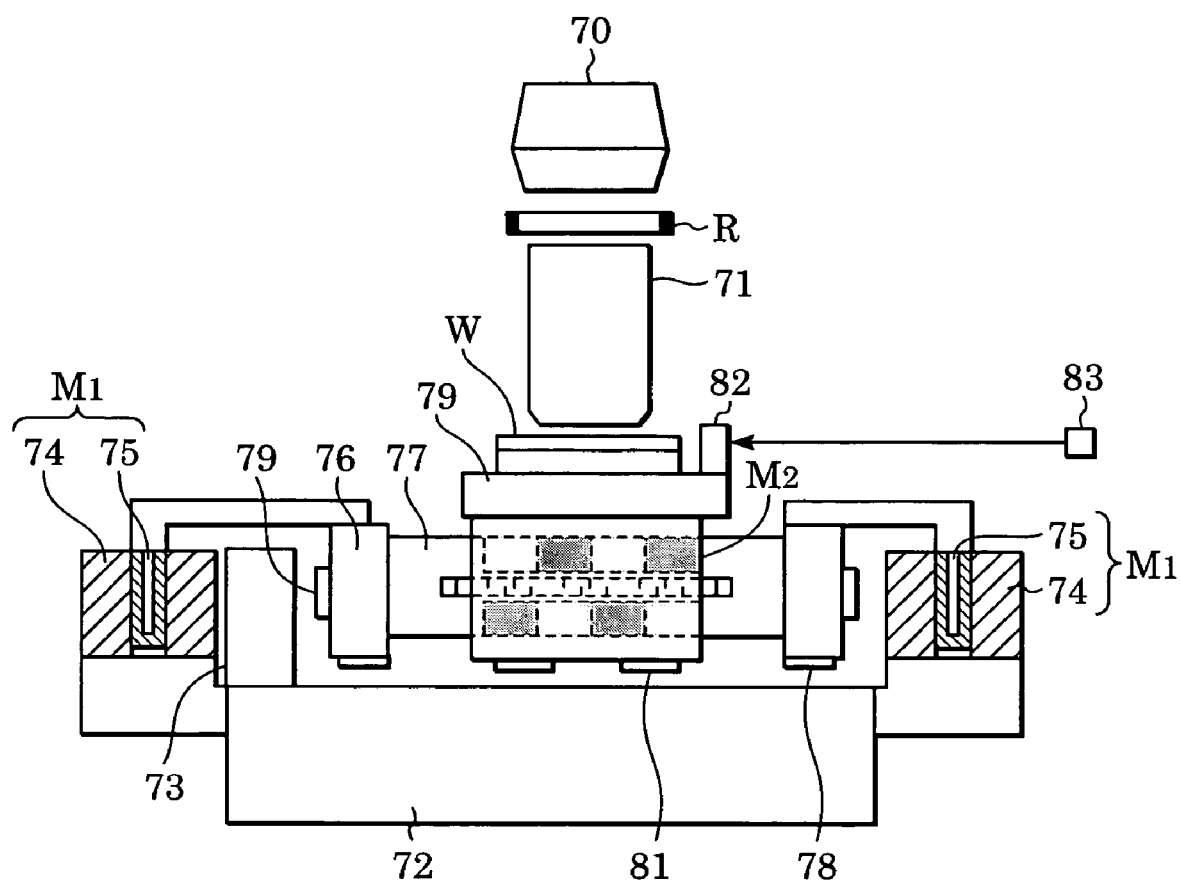
FIG. 13 is a representation of an exposure apparatus according to a fourth embodiment of the present invention.

FIG. 13 shows an exposure apparatus for manufacturing semiconductors, the exposure apparatus using the same stage apparatus as in the foregoing, as a wafer stage.

This exposure apparatus is used for manufacturing devices, such as semiconductor devices in semiconductor integrated circuits, micromachines, thin film magnetic heads, and the like, on which minute patterns are formed. In this exposure apparatus, a wafer serving as a substrate is irradiated, via a reticle R as an original plate, with exposure light (this term collectively refers to visible light, ultraviolet light, extreme ultraviolet (EUV) light, X-rays, electronic rays, charged-particle rays, etc.), functioning as exposure energy from a light source 70, through projection lenses 71 (this term collectively refers to a refraction lens, a reflection lens, a reflection-refraction lens system, a charged particle lens, etc.), serving as a projection system, and thereby, a desired pattern is formed on the substrate.

In this exposure apparatus, a guide 73 and a linear motor stator 74 is fixed onto the surface plate 72. As in the case of the foregoing, the linear motor stator 74 has a multiphase electromagnetic coil, and the linear motor movable element 75 has a permanent magnet group. The linear motor movable element 75 functioning as a movable portion 76 is connected to the movable guide 77 serving as a stage, and the movable guide 77 is moved in the direction normal to the plane of the drawing (FIG. 13) by the drive force of the linear motor M1. The movable portion 76 is supported by the hydrostatic bearings 81 relative to the top surface of the surface plate 72, and supported relative to the hydrostatic bearing 79 relative to a side surface of the guide 73.

The movable stage 80, which is a stage arranged so as to straddle the movable guide 77, is supported by the hydrostatic bearings 81. This movable stage 80 is driven by a linear motor M2 similar to the foregoing, and moves in the left and right directions on the plane of the drawing (FIG. 13) relative to the movable guide 77. The movement of the movable stage 80 is measured by a mirror 82 and an interferometer 83 provided to the movable stage 80.

A wafer W serving as a substrate is held on a chuck mounted on the movable stage 80, and a pattern of a reticle R serving as an original plate is reduction-transferred upon areas on the wafer W by a step-and-repeat or a step-and-scan method, using a light source 70 and a projection optical system 71.

The linear motors in the present invention can also be applied to an exposure apparatus of a type in which a circuit pattern is directly rendered on the semiconductor wafer and a resist is exposed, without using a mask.

Fifth Embodiment

Next, the manufacturing process of semiconductor devices by this exposure apparatus will be described. FIG. 14 shows the flow of the overall process for manufacturing semiconductor devices. In step 1 (circuit design), a semiconductor device circuit is designed. In step 2 (mask making), a mask is made based on the designed circuit pattern.

On the other hand, in step 3 (wafer manufacture), a wafer is manufactured by using a material such as silicon. In step 4 (wafer process), called a front end process, an actual circuit is formed on the wafer by lithography using the aforementioned mask and wafer using the above-described exposure apparatus. Step 5 (assembly), called a back end process, is the step of forming a semiconductor chip by using the wafer formed in step 4, and includes an assembly process (dicing and bonding) and a packaging process (chip encapsulation). In step 6 (inspection), the semiconductor device manufactured in step 5 is subjected to inspections, such as an operation confirmation test and a durability test. After these steps, the semiconductor device is completed and shipped, in step 7.

The wafer process in step 4 comprises the following steps: the wafer process includes an oxidation step of oxidizing the wafer surface, a CVD (chemical-vapor deposition) step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of transferring the circuit pattern onto the wafer after having undergone the resist processing step using the above-described exposure apparatus, a development step of developing the wafer exposed in the exposure step, an etching step of etching a portion except for the resist image developed in the development step, and a resist removal step of removing an unnecessary resist after etching. These steps are repeated to form multiple circuit patterns on the wafer.

Except as otherwise discussed herein, the various components shown in outline or in block form in the Figures are individually well known and their internal construction and operation are not critical either to the making or using or to a description of the best mode of the invention.

While the present invention has been described with reference to what are at present considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2003-380079 filed Nov. 10, 2003, which is hereby incorporated by reference herein.

What is claimed is:

1. A stage apparatus comprising:
   a movable member that moves at least in a first direction and a second direction;
   a mounting base supporting the movable member, and moving on a reference surface so as to cancel out a reaction force resulting from a movement of the movable member; and
   support means for supporting the mounting base above the reference surface, the support means including:
   (i) a first magnet unit disposed on said mounting base;
   (ii) a second magnet unit, disposed on the reference surface, said second magnet unit including a pair of permanent magnets, wherein said first magnet unit is disposed in a non-contact position between the pair of permanent magnets of said second magnet unit, with each of magnetic poles of said first magnet unit oriented opposed to like magnetic poles of said first and second permanent magnets; and
   area adjusting means that adjusts a facing area between the magnet of said first magnet unit and each of the magnets of said second magnet unit.

2. The stage apparatus according to claim 1, wherein, in a predetermined range of relative positions between said first magnet unit and said second magnet unit in the first and second directions, the dimension of each of said first magnet unit and said second magnet unit is set so that a force acting between said first magnet unit and said second magnet unit is reduced to a predetermined amount.

3. The stage apparatus according to claim 1, wherein sizes of said first and second magnet units are set such that no force acts between said first and second magnet units in a direction perpendicular to a direction in which said first magnet unit supports the support target.

4. The stage apparatus according to claim 1, wherein the following relations are satisfied: (1) [(stroke of movement of the movable member in the first direction)×(mass of a moving portion)/(mass of the mounting base)]<[space between said first magnet unit and said second magnet unit in the first direction]; and (2) [(stroke of movement of the movable member in the second direction)×(mass of a moving portion)/(mass of the mounting base)]<[length in the second direction, of said second magnet unit facing the first magnet unit].

5. The stage apparatus according to claim 1, wherein said first magnet unit is disposed on the reference surface while said second magnet unit is disposed on the mounting base.

6. An exposure apparatus that exposes a pattern on a substrate, the exposure apparatus comprising:
   the stage apparatus as recited in claim 1, the stage apparatus being used for positioning the substrate.

7. A method of manufacturing a device, the method comprising:
   a step of manufacturing a device by using the exposure apparatus as recited in claim 6.

* * * * *